(12) United States Patent
Park

(10) Patent No.: US 9,397,020 B2
(45) Date of Patent: Jul. 19, 2016

(54) SEMICONDUCTOR PACKAGE

(71) Applicant: Samsung Electronics Co., Ltd., Suwon-si, Gyeonggi-do (KR)

(72) Inventor: Jin-Woo Park, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 5 days.

(21) Appl. No.: 14/455,849

(22) Filed: Aug. 8, 2014

(65) Prior Publication Data

US 2015/0048501 A1 Feb. 19, 2015

(30) Foreign Application Priority Data

Aug. 14, 2013 (KR) .................. 10-2013-0096576

(51) Int. Cl.
*H01L 23/00* (2006.01)
*H01L 23/31* (2006.01)
*H01L 23/13* (2006.01)
*H01L 21/56* (2006.01)
*H01L 23/498* (2006.01)

(52) U.S. Cl.
CPC ............ *H01L 23/3128* (2013.01); *H01L 23/13* (2013.01); *H01L 21/56* (2013.01); *H01L 23/49822* (2013.01); *H01L 2224/16225* (2013.01); *H01L 2224/16227* (2013.01); *H01L 2924/00014* (2013.01); *H01L 2924/1517* (2013.01); *H01L 2924/15151* (2013.01); *H01L 2924/181* (2013.01)

(58) Field of Classification Search
CPC .............. H01L 2924/00; H01L 2224/48247; H01L 2924/00014; H01L 23/3128; H01L 23/3135; H01L 23/315

See application file for complete search history.

(56) References Cited

U.S. PATENT DOCUMENTS

| 6,338,985 | B1 * | 1/2002 | Greenwood | .......... H01L 21/561 257/723 |
|---|---|---|---|---|
| 6,451,625 | B1 | 9/2002 | Pu et al. | |
| 6,560,122 | B2 | 5/2003 | Weber | |
| 6,772,512 | B2 * | 8/2004 | Tsai | ...................... H01L 21/563 156/245 |
| 6,838,313 | B2 | 1/2005 | Kumamoto et al. | |
| 6,963,142 | B2 | 11/2005 | Bolken | |
| 7,888,602 | B2 | 2/2011 | Park | |
| 8,058,725 | B2 | 11/2011 | Chen et al. | |
| 8,241,968 | B2 | 8/2012 | Lee et al. | |
| 8,273,607 | B2 | 9/2012 | Park et al. | |
| 2002/0043721 | A1 | 4/2002 | Weber | |
| 2002/0092162 | A1 | 7/2002 | Tsai et al. | |
| 2002/0095192 | A1 | 7/2002 | Pu et al. | |

(Continued)

FOREIGN PATENT DOCUMENTS

| KR | 100498974 B1 | 7/2005 |
|---|---|---|
| KR | 100652064 B1 | 11/2006 |

(Continued)

*Primary Examiner* — Marc Armand
*Assistant Examiner* — Quinton Brasfield
(74) *Attorney, Agent, or Firm* — Renaissance IP Law Group LLP

(57) ABSTRACT

A semiconductor package includes a substrate including a lower plate and an upper plate, a semiconductor chip mounted on a top surface of the substrate, and a mold layer surrounding a sidewall and a bottom surface of the semiconductor chip. The substrate has a mold path including an inner path extending between the lower and upper plates and a mold hole penetrating the upper plate. The mold hole is connected to the inner path. The mold layer extends into the mold path.

19 Claims, 17 Drawing Sheets

(56) References Cited

U.S. PATENT DOCUMENTS

| | | |
|---|---|---|
| 2002/0173074 A1 | 11/2002 | Chun-Jen et al. |
| 2003/0001252 A1* | 1/2003 | Ku .................... H01L 23/3107 257/686 |
| 2003/0080441 A1 | 5/2003 | Bolken |
| 2004/0053443 A1 | 3/2004 | Kumamoto et al. |
| 2008/0105974 A1 | 5/2008 | Chen et al. |
| 2008/0298029 A1 | 12/2008 | Park |
| 2011/0037136 A1* | 2/2011 | Chow ................ H01L 27/14618 257/433 |
| 2011/0193228 A1 | 8/2011 | Yu et al. |
| 2011/0207266 A1* | 8/2011 | Lee ..................... H01L 21/486 438/126 |
| 2011/0312133 A1 | 12/2011 | Park et al. |
| 2012/0139109 A1* | 6/2012 | Choi ....................... H01L 21/56 257/738 |
| 2012/0175786 A1 | 7/2012 | Kiong et al. |
| 2012/0319266 A1 | 12/2012 | Park et al. |
| 2013/0105988 A1* | 5/2013 | Lee .................... H01L 25/0657 257/774 |
| 2014/0008795 A1* | 1/2014 | Kim .................. H01L 23/49816 257/738 |

FOREIGN PATENT DOCUMENTS

| | | |
|---|---|---|
| KR | 100930095 B1 | 12/2009 |
| KR | 20120062457 A | 6/2012 |

\* cited by examiner

SEMICONDUCTOR PACKAGE

CROSS-REFERENCE TO RELATED APPLICATION

This U.S. non-provisional patent application claims priority under 35 U.S.C. §119 to Korean Patent Application No. 10-2013-0096576, filed on Aug. 14, 2013, in the Korean Intellectual Property Office, the disclosure of which is hereby incorporated by reference in its entirety.

BACKGROUND

The inventive concepts relate to a semiconductor device and, more particularly, to semiconductor packages.

As the integration density of semiconductor integrated circuits have increased, the number of pins for electrode terminals of a semiconductor chip has also remarkably increased and a pitch of the pins of the semiconductor chip has been rapidly reduced. Printed circuit boards are widely used to reduce sizes of semiconductor packages. Additionally, flip chip bonding techniques are widely used to reduce an interconnection delay between a semiconductor chip and a circuit board in a semiconductor package. A space between the semiconductor chip and the circuit board may be filled with a mold layer for a semiconductor package without an additional underfill resin.

SUMMARY

Embodiments of the inventive concepts may provide semiconductor packages having excellent reliability.

Embodiments of the inventive concepts may also provide semiconductor packages that do not limit positions of external terminals.

In one aspect, a semiconductor package may include: a substrate including a lower plate and an upper plate, the substrate having a mold path, the mold path including an inner path extending between the lower and upper plates and a mold hole penetrating the upper plate, and the mold hole connected to the inner path; a semiconductor chip mounted on a top surface of the substrate; and a mold layer encapsulating the semiconductor chip, the mold layer further extending into the mold path.

In some embodiments, the mold layer may extend into the inner path through the mold hole.

In some embodiments, the inner path may include a first groove formed at a bottom surface of the upper plate.

In some embodiments, the inner path may further include a second groove formed at a top surface of the lower plate. The second groove may be connected to the first groove.

In some embodiments, the first groove may extend in one direction, and the second groove may extend in another direction to cross the first groove.

In some embodiments, the second groove may include a plurality of second grooves.

In some embodiments, the mold hole may be connected to the first groove.

In some embodiments, the inner path may include a groove formed at a top surface of the lower plate.

In some embodiments, the semiconductor package may further include: bumps disposed between the substrate and the semiconductor chip. The mold layer may fill a space between the bumps.

In some embodiments, the semiconductor chip may overlap with the mold hole.

In another aspect, a semiconductor package may include: a substrate including a lower plate and an upper plate, a first groove formed at a bottom surface of the upper plate, a plurality of second grooves formed in a top surface of the lower plate, the second grooves connected to the first groove, a mold hole penetrating the upper plate, and the mold hole connected to the first groove; a semiconductor chip mounted on a top surface of the substrate; and a mold layer encapsulating the semiconductor chip, the mold layer further extending into the mold hole.

In some embodiments, the mold layer may further extend into the first groove and the second grooves.

In some embodiments, the first groove may extend in one direction, and the second grooves may cross the first groove.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
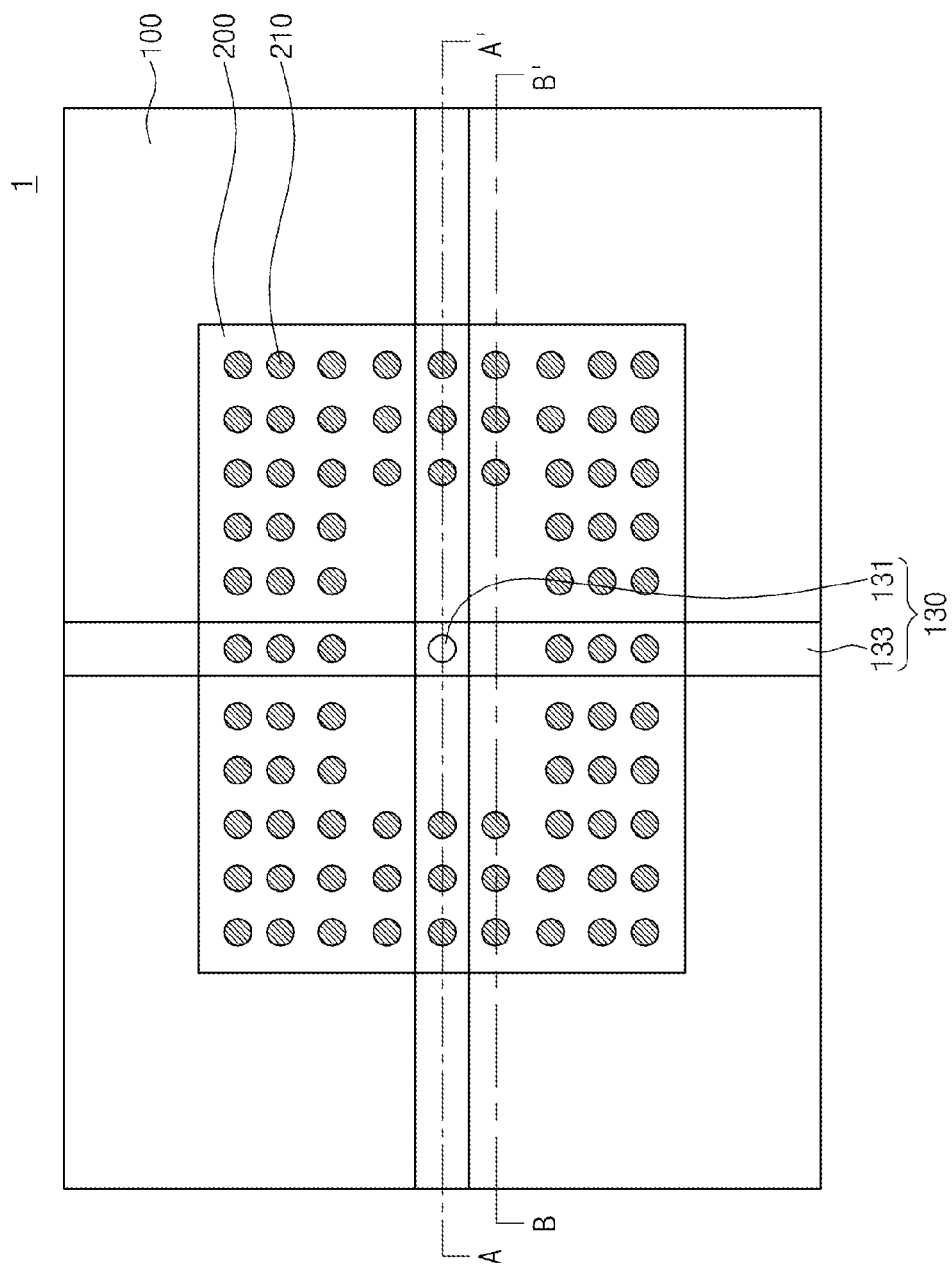
FIG. 1 is a plan view illustrating a semiconductor package according to some embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 2:
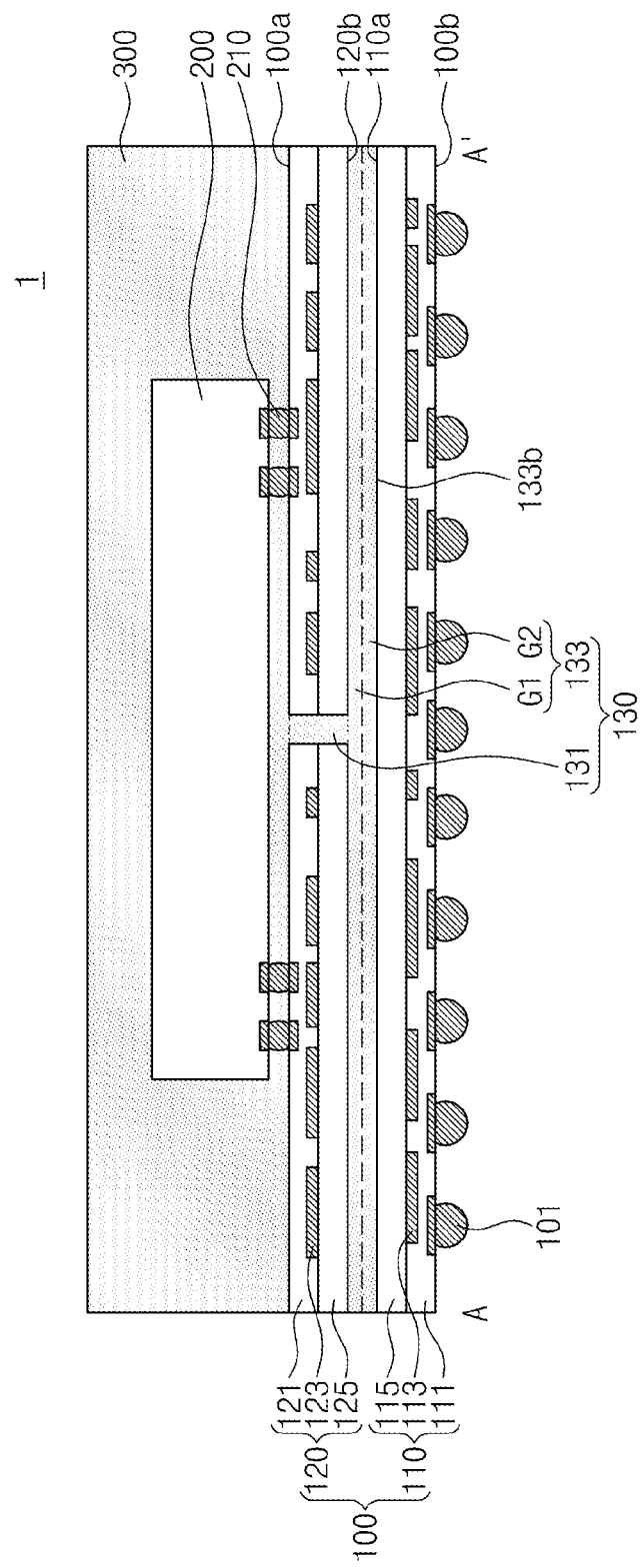
FIG. 2 is a cross-sectional view taken along a line A-A' of FIG. 1.
Figure 3:
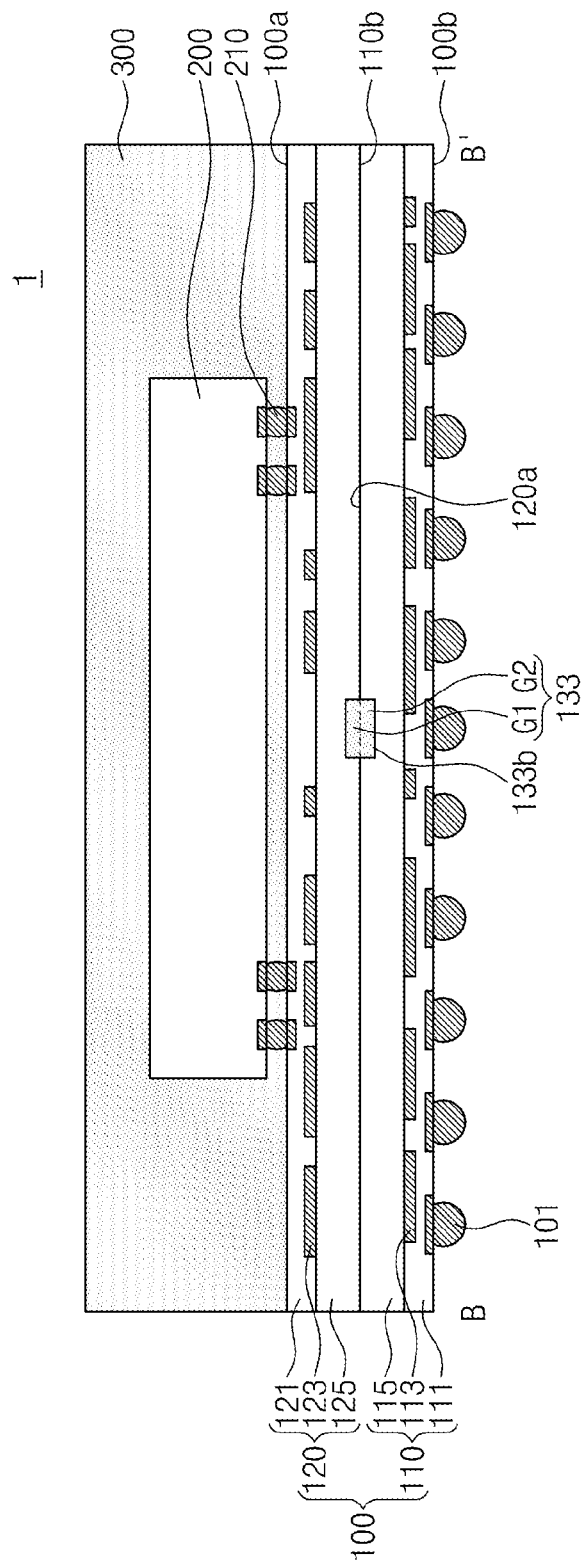
FIG. 3 is a cross-sectional view taken along a line B-B' of FIG. 1.

FIG. 1 is a plan view illustrating a semiconductor package according to some embodiments of the inventive concepts. FIG. 2 is a cross-sectional view taken along a line A-A' of FIG. 1. FIG. 3 is a cross-sectional view taken along a line B-B' of FIG. 1.

Referring to FIGS. 1 to 3, a semiconductor package 1 may include a substrate 100, a semiconductor chip 200, bumps 210, and a mold layer 300.

The substrate 100 may be a printed circuit board (PCB) having circuit patterns or conductive traces. The substrate 100 may have a top surface 100a and a bottom surface 100b opposite to each other. The substrate 100 may include a lower plate 110 and an upper plate 120. The lower plate 110 may include a lower protection layer 111, lower circuit patterns 113, and a lower base layer 115. The upper plate 120 may include an upper base layer 125, upper circuit patterns 123, and an upper protection layer 121. For example, the lower and upper base layers 115 and 125 may include glass fiber.

The substrate 100 may have a mold path 130 therein. The mold path 130 may include at least one mold hole 131 and at least one inner path 133. The inner path 133 may be disposed between the lower plate 110 and the upper plate 120. The inner path 133 may extend in a direction substantially parallel to the top surface 100a of the substrate 100. The number and a shape of the inner path 133 may be variously modified. The inner path 133 may have a first groove G1 provided at a bottom surface 120b of the upper plate 120 and a second groove G2 provided at a top surface 110a of the lower plate 110. In other words, the first groove G1 may correspond to a recessed region of the bottom surface 120b of the upper plate 120, and the second groove G2 may correspond to a recessed region of the top surface 110a of the lower plate 110. The second groove G2 may be connected to the first groove G1. In some embodiments, the second groove G2 may have the same shape and the same size as the first groove G1 and may overlap with the first groove G1.

In some embodiments, the first and second grooves G1 and G2 may extend in parallel to each other. The mold hole 131 may be connected to the inner path 133. The mold hole 131 may penetrate the upper plate 120 between the bumps 210. The mold hole 131 may extend in a substantially perpendicular direction with respect to the top surface 100a of the substrate 100. The number and/or a shape of the mold hole 131 may be variously modified.

In some embodiments, the mold path 130 may include a plurality of inner paths 133 crossing each other and the mold hole 131 may be formed in a crossing region of the inner paths 133. If the inner path 133 is exposed at the bottom surface 100b of the substrate 100, the semiconductor package 1 may be contaminated by impurities present in the inner path 133. According to some embodiments of the inventive concepts, the lower plate 110 (or the lower protection layer 111) covers a bottom surface 133b of the inner path 133 to prevent contamination of the semiconductor package 1.

External terminals 101 may be disposed on the bottom surface 100b of the substrate 100 to electrically connect the semiconductor chip 200 to an external device (not shown). The external terminals 101 may include a conductive material. The external terminals 101 may have solder ball-shapes. If the inner path 133 is exposed at the bottom surface 100b of the substrate 100, placement of the external terminals 101 may be impeded by the inner path 133. According to some embodiments of the inventive concepts, the lower plate 110 covers the bottom surface 133b of the inner path 133, so that the positions of the external terminals 101 may not be limited.

The semiconductor chip 200 may be disposed on the top surface 100a of the substrate 100. In some embodiments, the mold hole 131 may overlap with at least a portion of the inner path 133 when viewed in plan view. The semiconductor chip 200 may include an integrated circuit such as a memory circuit and/or a logic circuit. The bumps 210 may be disposed between the substrate 100 and the semiconductor chip 200. The bumps 210 may include a conductive material. The semiconductor chip 200 may be electrically connected to the substrate 100 through the bumps 210.

The mold layer 300 may be disposed on the top surface 100a of the substrate 100. The mold layer 300 may fill a space between the bumps 210. Additionally, the mold layer 300 may surround a sidewall of the semiconductor chip 200. The mold layer 300 may seal the semiconductor chip 200. The mold layer 300 may extend into the inner path 133 through the mold hole 131. The mold layer 300 may include an insulating polymer material such as an epoxy-molding compound. If the mold path 130 is omitted, a void may be generated in the mold layer 300 between the bumps 210. According to some embodiments of the inventive concepts, the mold layer 300 may extend into the mold path 130, so that the void between the bumps 210 may be removed.

The substrate 100, for example, the upper plate 120 and the lower plate 110 may have a thermal expansion coefficient different from that of the mold layer 300. If the mold path 130 is omitted, a warpage phenomenon of the semiconductor package 1 may occur due to a difference between the thermal expansion coefficients of the substrate 100 and the mold layer 300. However, according to some embodiments of the inventive concepts, a portion of the mold layer 300 extends into (or disposed in) the mold path 130 between the upper and lower plates 120 and 110 to reduce a difference between thermal expansion coefficients of the mold layer 300 and those of the substrate 100 including the mold path 130. Thus, the warpage phenomenon of the semiconductor package 1 may be substantially reduced.

Figure 4:
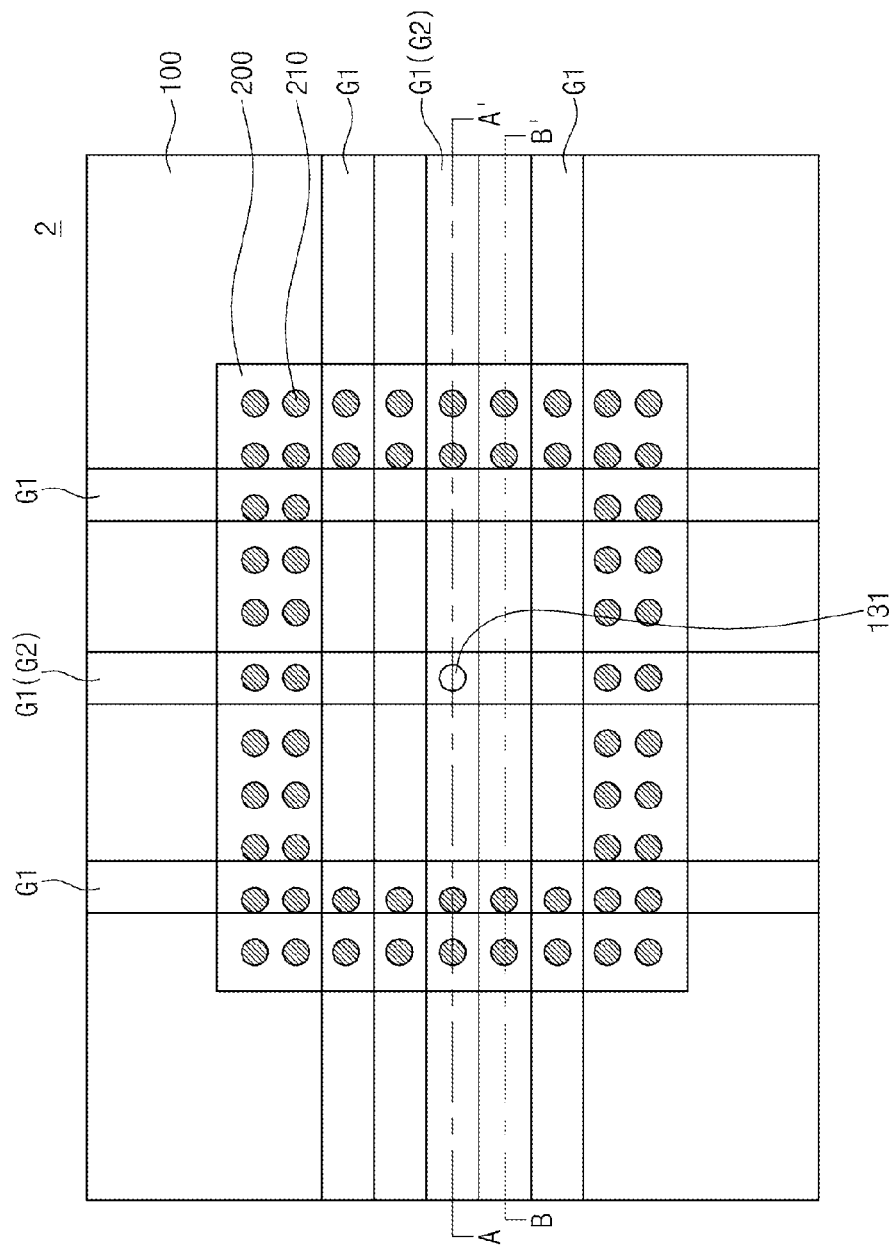
FIG. 4 is a plan view illustrating a semiconductor package according to other embodiments of the inventive concepts.
Figure 5:
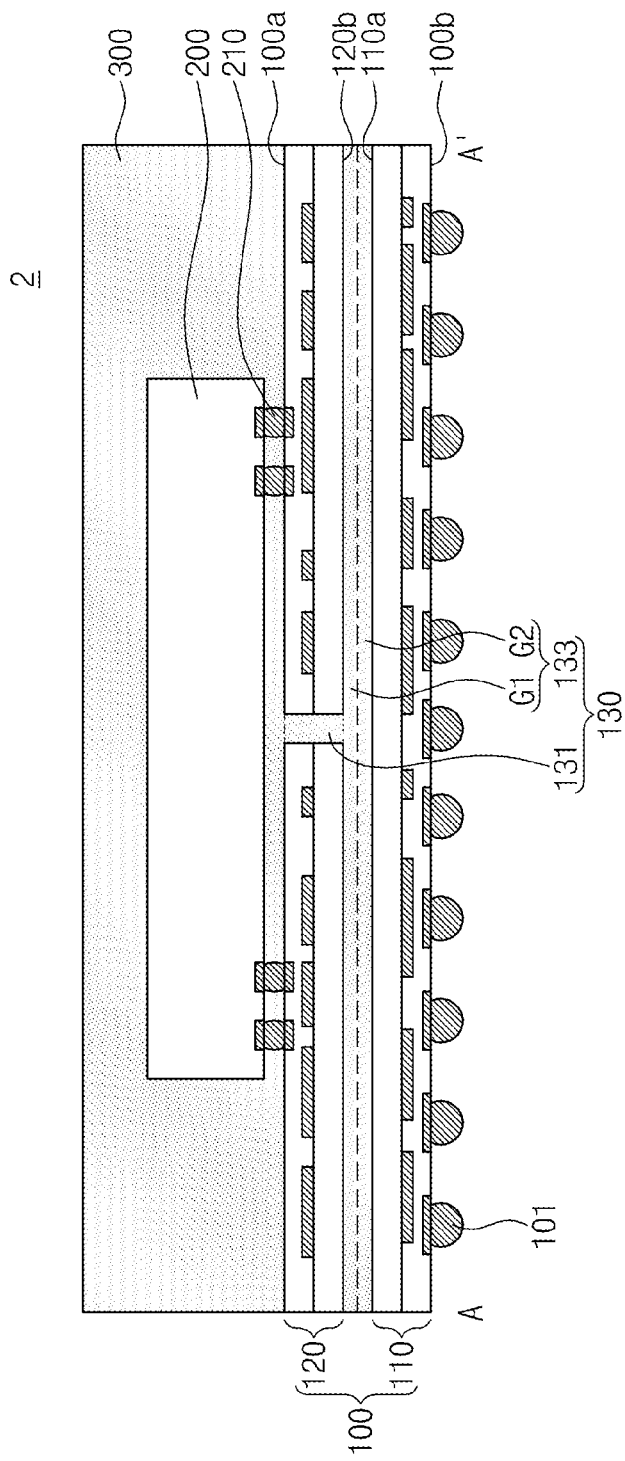
FIG. 5 is a cross-sectional view taken along a line A-A' of FIG. 4.
Figure 6:
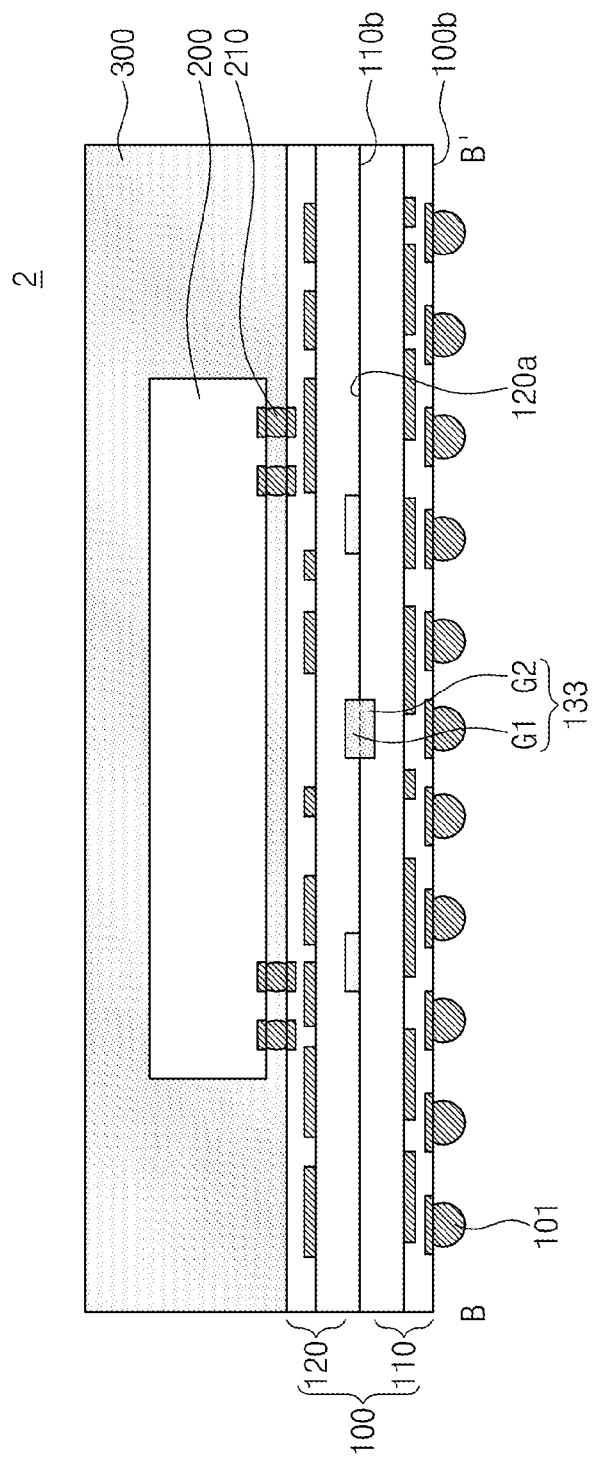
FIG. 6 is a cross-sectional view taken along a line B-B' of FIG. 4.

FIG. 4 is a plan view illustrating a semiconductor package according to other embodiments of the inventive concepts. FIG. 5 is a cross-sectional view taken along a line A-A' of FIG. 4. FIG. 6 is a cross-sectional view taken along a line B-B' of FIG. 4. In these embodiments, the same descriptions as described in the aforementioned embodiment will be omitted or mentioned briefly for the sake of brevity.

Referring to FIGS. 4 to 6, a semiconductor package 2 may include a substrate 100, bumps 210, a semiconductor chip 200, and a mold layer 300. The substrate 100 may include the lower plate 110 and the upper plate 120, as described with reference to FIGS. 1 to 3. External terminals 101 may be provided on the bottom surface 100b of the substrate 100.

A mold path 130 may include a mold hole 131 and an inner path 133. The mold layer 300 may extend into or arranged in the mold path 130. The inner path 133 may not be exposed at the bottom surface 100b of the substrate 100. The inner path 133 may include a plurality of first grooves G1 provided at the bottom surface 120b of the upper plate 120 and at least one second groove G2 provided at the top surface 110a of the lower plate 110. The mold hole 131 may be connected to one of the first grooves G1. The first grooves G1 may be connected to the second groove G2. In some embodiments, one of the first grooves G1 may have substantially the same shape and substantially the same size as the second groove G2 and may overlap in parallel and substantially aligned with the second groove G2. Other grooves from among the first grooves G1 may extend in a different direction from a direction in which the second groove G2 extends such that the first grooves G1 cross the second groove G2.

The number, a shape, a size and a position of the first groove G1 and/or the second groove G2 may be varied depending on thermal expansion coefficients of the mold layer 300 and the substrate 100. For example, the thermal expansion coefficient of the substrate 100 may be greater than that of the mold layer 300. If the mold path 130 is omitted, both ends of the semiconductor package 2 may warp upward at high temperatures and may warp downward at low temperatures. In the present embodiment, the number and/or a total occupying area of the first grooves G1 may be greater than the number and/or a total occupying area of the second groove G2. The inner path 133 may apply a force in a direction opposite to a warpage direction of the semiconductor package 2, so that a warpage phenomenon of the semiconductor package 2 may be substantially alleviated.

Figure 7:
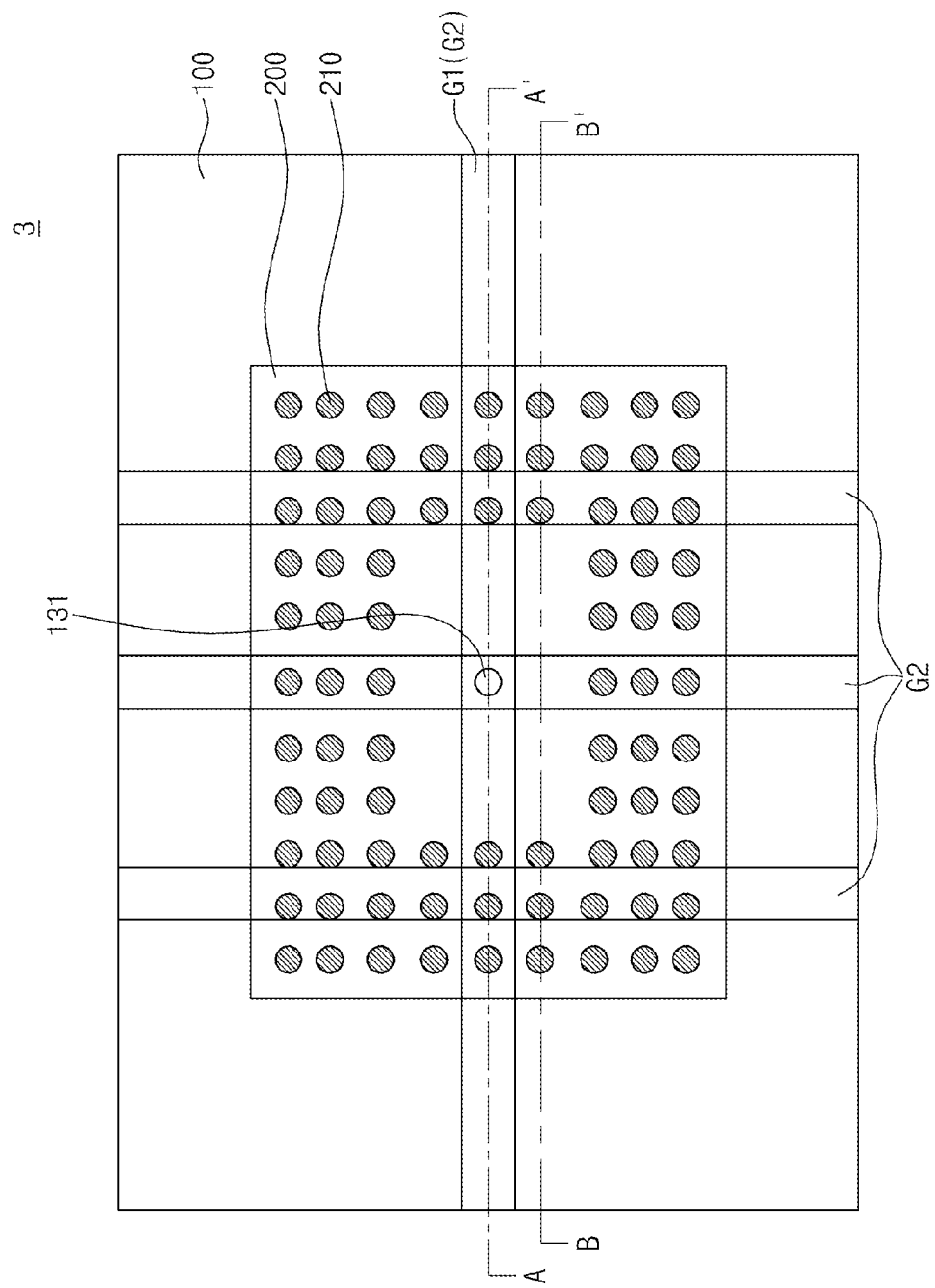
FIG. 7 is a plan view illustrating a semiconductor package according to still other embodiments of the inventive concepts.
Figure 8:
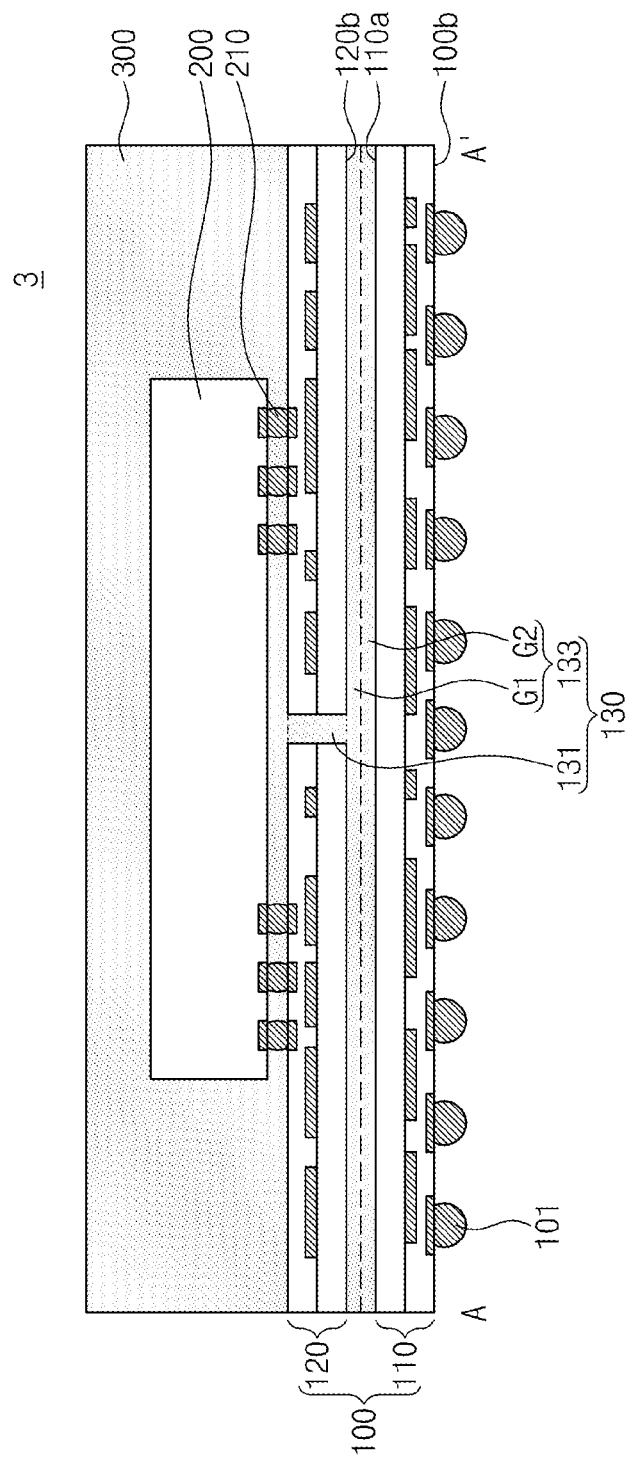
FIG. 8 is a cross-sectional view taken along a line A-A' of FIG. 7.
Figure 9:
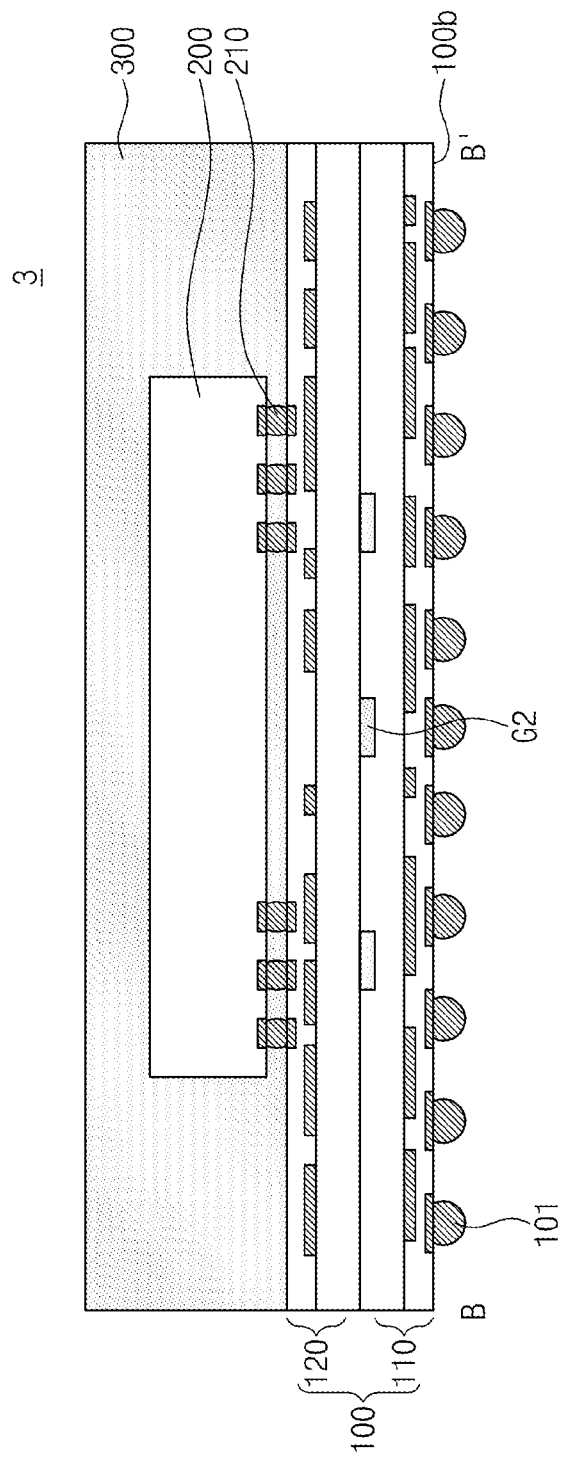
FIG. 9 is a cross-sectional view taken along a line B-B' of FIG. 7.

FIG. 7 is a plan view illustrating a semiconductor package according to still other embodiments of the inventive concepts. FIG. 8 is a cross-sectional view taken along a line A-A' of FIG. 7. FIG. 9 is a cross-sectional view taken along a line B-B' of FIG. 7. In the present embodiments, the same descriptions as described in the aforementioned embodiments will be omitted or mentioned briefly for the sake of brevity.

Referring to FIGS. 7 to 9, a semiconductor package 3 may include a substrate 100, bumps 210, a semiconductor chip 200, and a mold layer 300. The substrate 100 may include a lower plate 110 and an upper plate 120. External terminals 101 such as solder balls may be provided on the bottom surface 100b of the substrate 100.

A mold path 130 may include a mold hole 131 and an inner path 133. The mold layer 300 may extend into or arranged in the mold path 130. The inner path 133 may include a first groove G1 and a plurality of second grooves G2. The mold hole 131 may be connected to the first groove G1. The second grooves G2 may be connected to or combined with the first groove G1.

In some embodiments, one of the second grooves G2 may have substantially the same shape and substantially the same size as the first groove G1 and may overlap in parallel and substantially aligned with the first groove G1. Other grooves from among the second grooves G2 may extend in a different direction from a direction in which the first groove G1 extends such that the second grooves G2 cross the first groove G1. In some embodiments, the substrate 100 may be formed of a material having a thermal expansion coefficient less than that of the mold layer 300. In this case, if the inner path 133 is omitted, both ends of the semiconductor package 3 may warp upward at high temperatures and may warp downward at low temperatures. In the present embodiment, the number and/or a total occupying area of the second grooves G2 may be greater than the number and/or a total occupying area of the first groove G1. The inner path 133 may apply a force in a direction opposite to a warpage direction of the semiconductor package 3, so that the warpage phenomenon of the semiconductor package 3 may be substantially reduced.

FIGS. 10 to 13 are cross-sectional views illustrating a method of manufacturing a semiconductor package according to example embodiments of the inventive concepts. Hereinafter, the same descriptions as described in the aforementioned embodiments will be omitted or mentioned briefly for the purpose of simplicity.

Figure 10:
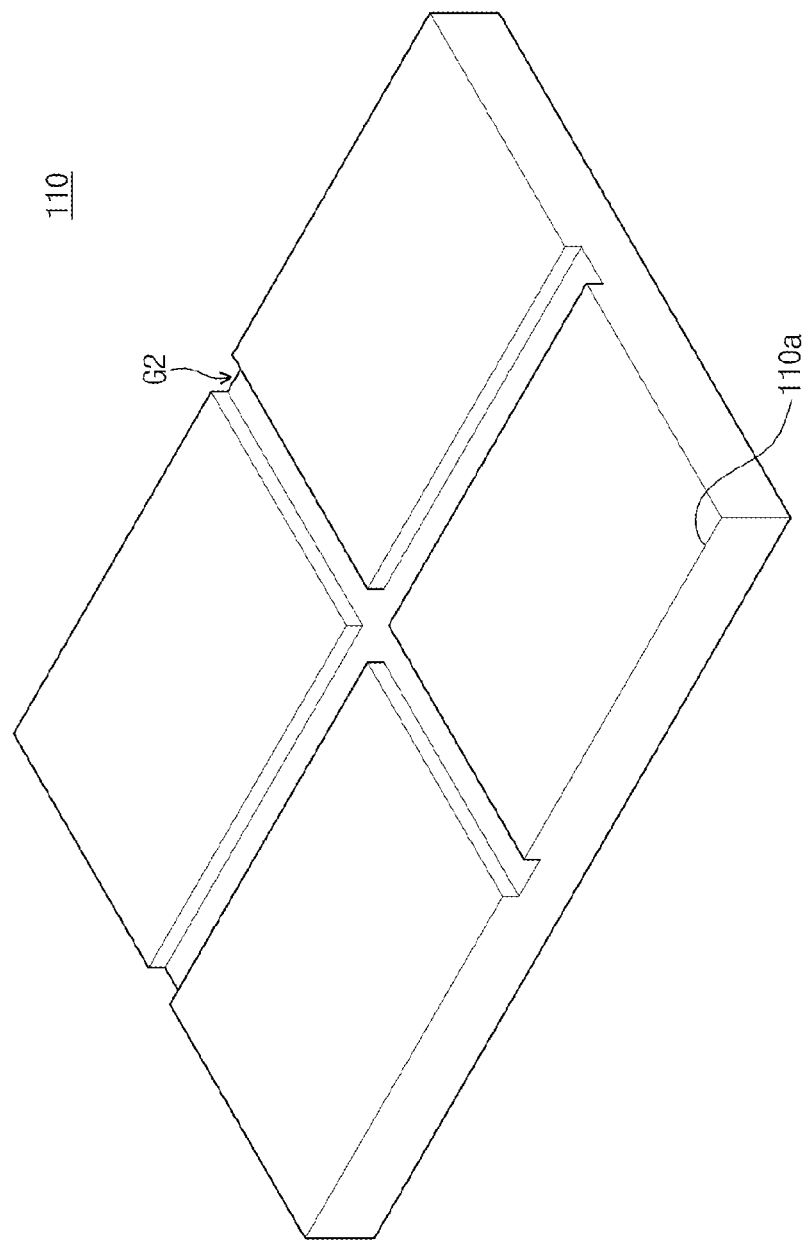
FIGS. 10 to 13 are cross-sectional views illustrating a method of manufacturing a semiconductor package according to example embodiments of the inventive concepts.

Referring to FIG. 10, a lower plate 110 having a second groove G2 may be prepared. In some embodiments, the second groove G2 may extend in one direction on the top surface 110a of the lower plate 110. In other embodiments, a plurality of second grooves G2 may be provided to cross each other.

Figure 11:
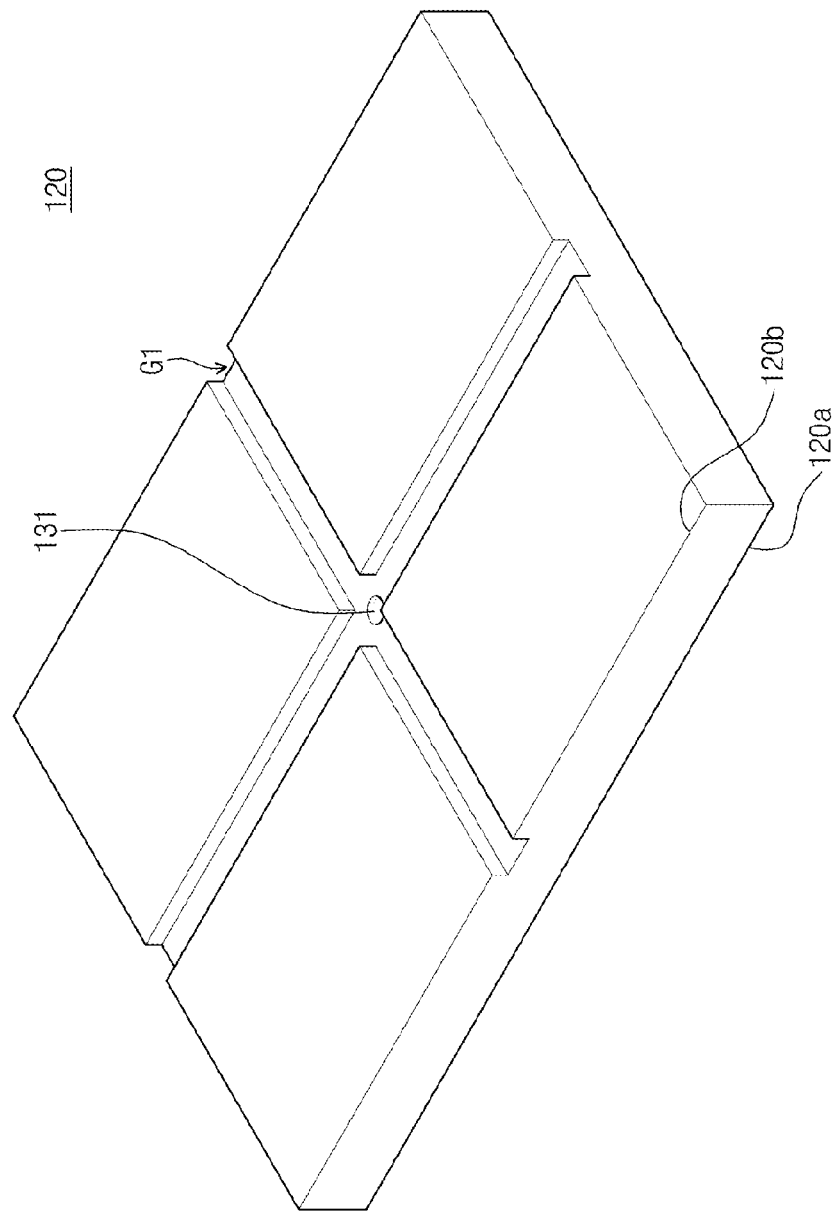

Referring to FIG. 11, an upper plate 120 having a first groove G1 and a mold hole 131 may be prepared. The first groove G1 may be provided on the bottom surface 120b of the upper plate 120. The first groove G1 may extend in one direction. In other embodiments, a plurality of first grooves G1 may be provided to cross each other. The mold hole 131 may penetrate the upper plate 120 from the top surface 120a to the bottom surface 120b of the upper plate 120. The mold hole 131 may overlap with the first groove G1 when viewed in plan view. Thus, the mold hole 131 may be coupled to the first groove G1. The shapes and sizes of the first groove G1 and the mold hole 131 may be variously modified.

Figure 12:
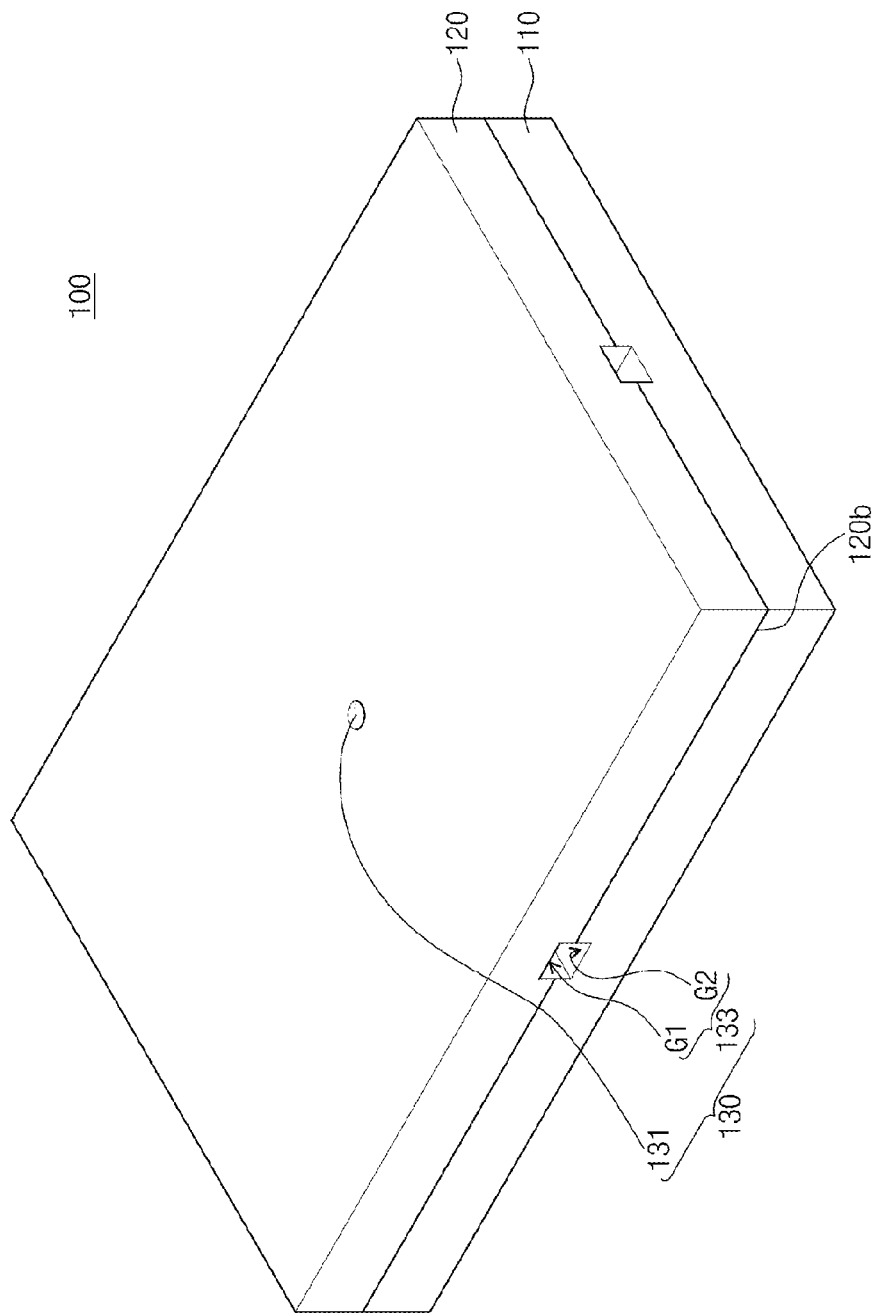

Referring to FIG. 12, the upper plate 120 may be bonded to the lower plate 110, thereby manufacturing a substrate 100 having a mold path 130. At this time, the bottom surface 120b of the upper plate 120 may be disposed to face the top surface 110a of the lower plate 110. The first groove G1 may be combined with the second groove G2, thereby forming an inner path 133. In some embodiments, the first groove G1 may overlap in parallel and aligned with the second groove G2. In other embodiments, the first groove G1 may be disposed to cross the second groove G2. The mold hole 131 may be connected to the inner path 133. In some embodiments, circuit patterns and protection layers may be disposed on the plates 110 and 120. In other embodiments, the plates 110 and 120 illustrated in FIGS. 10 and 11 may include the circuit patterns and the protection layers.

Figure 13:
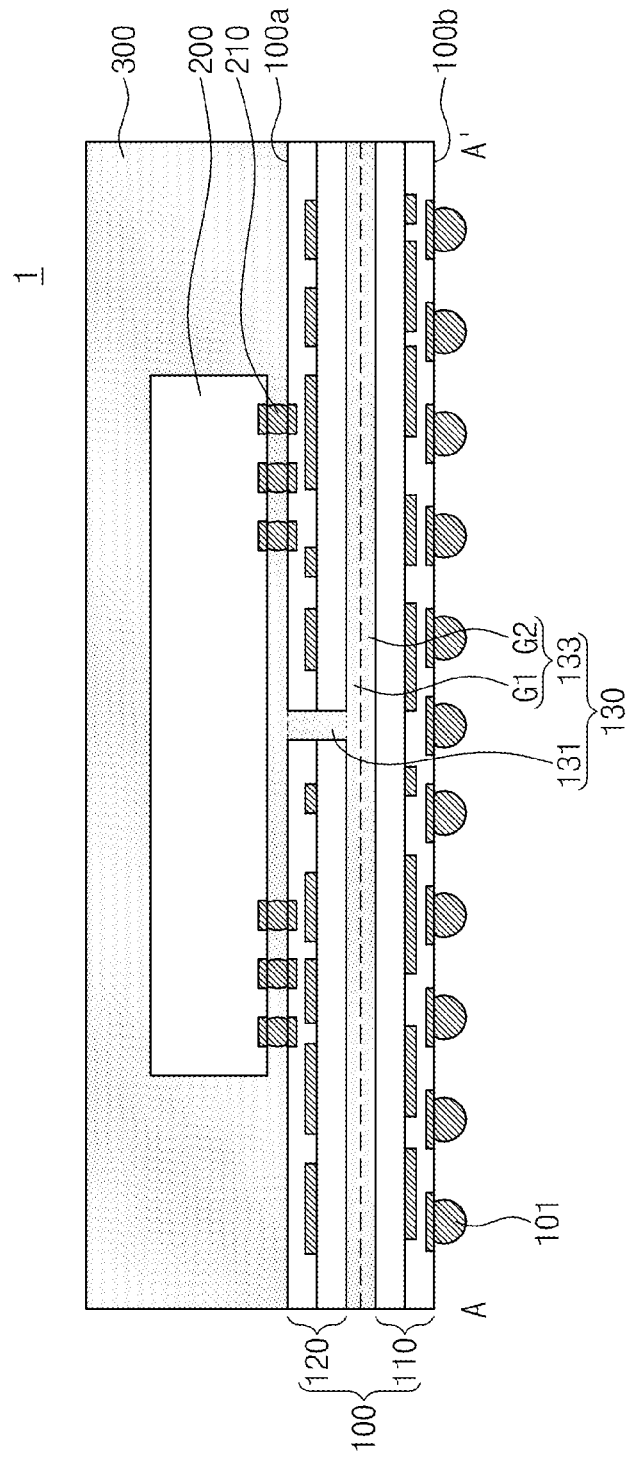

Referring to FIG. 13, a semiconductor chip 200 and a mold layer 300 may be formed on the top surface 100a of the substrate 100. The external terminals 101 may be formed on the bottom surface 110b of the lower plate 110. The external terminals 101 may be formed after or before a mounting process of the semiconductor chip 200. The semiconductor chip 200 may be mounted on the top surface 100a of the substrate 100. The semiconductor chip 200 may be electrically connected to the substrate 100 through bumps 210. The semiconductor chip 200 may overlap with the mold hole 131. The bumps 210 may not overlap with the mold holes 131. The mold layer 300 may be formed on the top surface 100a of the substrate 100 to surround a sidewall and a bottom surface of the semiconductor chip 200. The mold layer 300 may be formed by molding the semiconductor chip 200 with an insulating material (e.g., an epoxy molding compound). The mold layer 300 may extend into or arranged in the inner path 133 through the mold hole 131. Thus, the mold layer 300 may completely fill a space between the bumps 210, so that a void may not be generated in the mold layer 300 between the bumps 210. The lower plate 110 covers the inner path 133, so that the mold layer 300 may not be exposed at the bottom surface 100b of the substrate 100. According to some embodiments of the inventive concepts, the shape and/or the position of the inner path 133 may be controlled to prevent the warpage phenomenon of the semiconductor package 1. In some embodiments, the number and/or the position of each of the first and second grooves G1 and G2 may be controlled depending on the difference between the thermal expansion coefficients of the substrate 100 and the mold layer 300.

A mold hole alone may be formed that extends through the substrate to prevent the generation of a void between the bumps. The mold hole may thus improve the fluidity of the epoxy molding compound between the substrate and the semiconductor chip during the formation of the mold layer. Unfortunately, however, in this configuration, the epoxy molding compound may flow onto a bottom surface of the substrate through the mold hole. Thus, the epoxy molding compound on the bottom surface of the substrate may be contaminated during the manufacturing of a semiconductor package. Additionally, placement of external terminals such as solder balls on the bottom surface of the substrate may be impeded.

However, according to some embodiments of the inventive concepts, a substrate may include a lower plate and an upper plate and may have a mold path formed therebetween. In particular, the mold path may include an inner path extending between the lower and upper plates and a mold hole penetrating the upper plate. The mold hole may be connected to the inner path. A mold layer may extend into (and arranged in) the inner path through the mold hole. Thus, as discussed above, the mold layer may fill a space between bumps such that a void may not be generated in the mold layer between the bumps. Additionally, the inner path may not communicate with a bottom surface of the substrate, such that contamination problems and limitations of solder ball placement may be prevented.

The inventive concepts have been described above with reference to several specific embodiments. However, the inventive concepts may include other device structures where a mold layer is arranged in a mold path with any suitable shape, which can be configured other than as described above. For example, any configuration where the mold path is arranged in a substrate and connected via a mold hole to the top surface of the substrate is contemplated. The mold path may include an inner path that extends to sides of the substrate other than the top or bottom surface, such that the mold layer can substantially completely fill a space between bumps (such as bumps 210 of FIG. 6) and, thus, substantially no void may be generated in the mold layer between the bumps. Such configurations could, for instance, include a circular, spiraled, curved, straight line or any other desired arrangement for the inner path.

Figure 14:
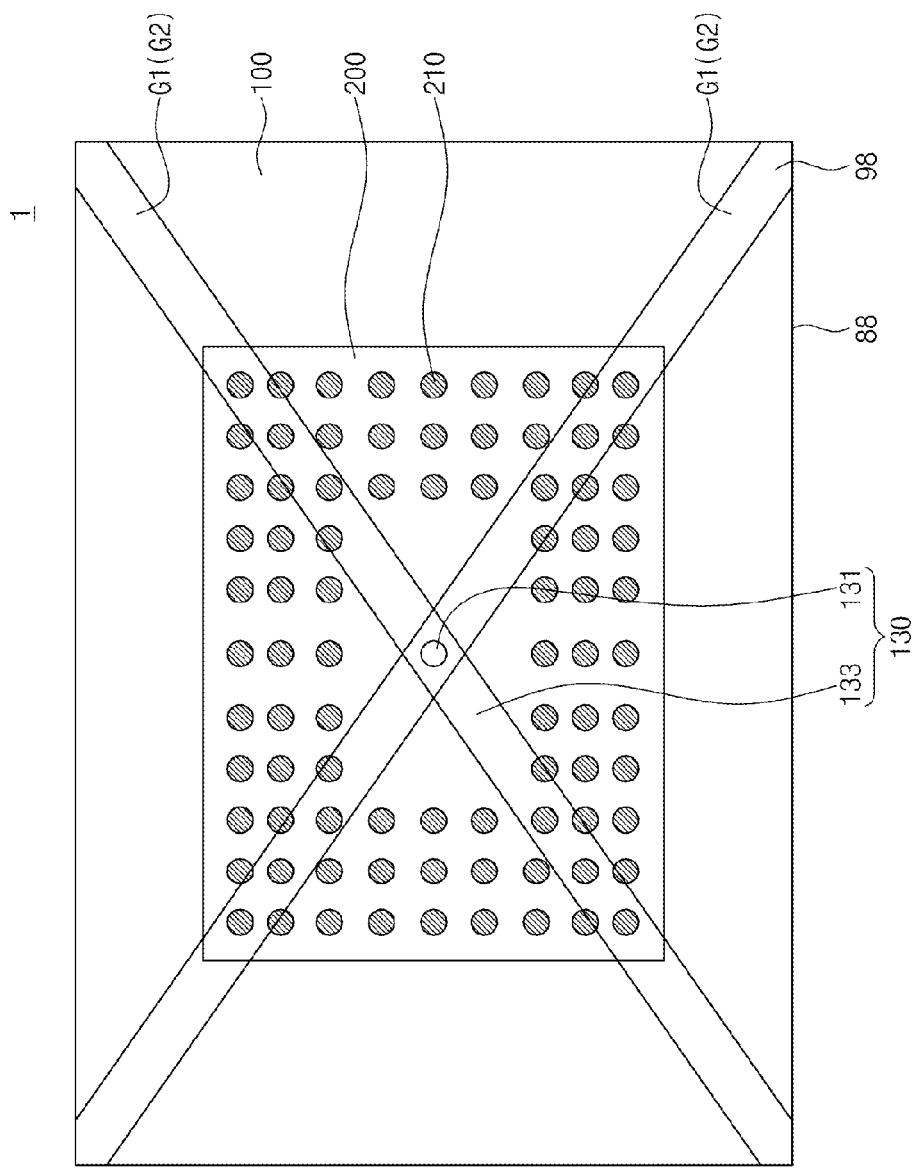
FIG. 14 is a plan view illustrating a semiconductor package according to some embodiments of the inventive concepts.

For example, as shown in FIG. 14, a mold path 130 including a mold hole 131 and an inner path 133. The inner path 133 may be formed in diagonally arranged grooves G1, G2 with respect to an edge 88 of the substrate 100 that extend to a corner area 98 of the substrate 100. Similar to the embodiments described above, the inner path 133 may be formed using a groove (G1) formed in an upper plate (not illustrated) and another groove (G2) formed in a lower plate (not illustrated), said upper and lower plates collectively forming the substrate 100.

In some embodiments, as shown in FIG. 12, an inner path 133 may again be coupled to a mold hole 131 extending through a top surface of a substrate 100. The inner path 133 may further be connected to a side surface of the substrate 100, rather than the bottom surface of the substrate 100. As a result, the contamination of the bottom surface of the substrate may be prevented.

[Applications]

Figure 15:
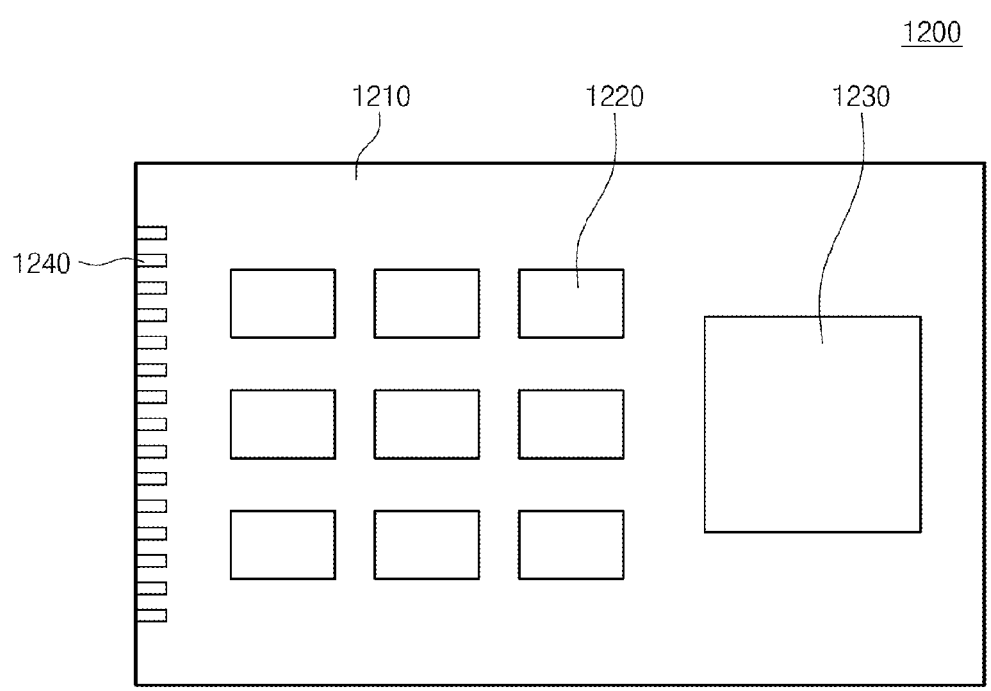
FIG. 15 illustrates an example of package modules including semiconductor packages according to embodiments of the inventive concepts.
Figure 16:
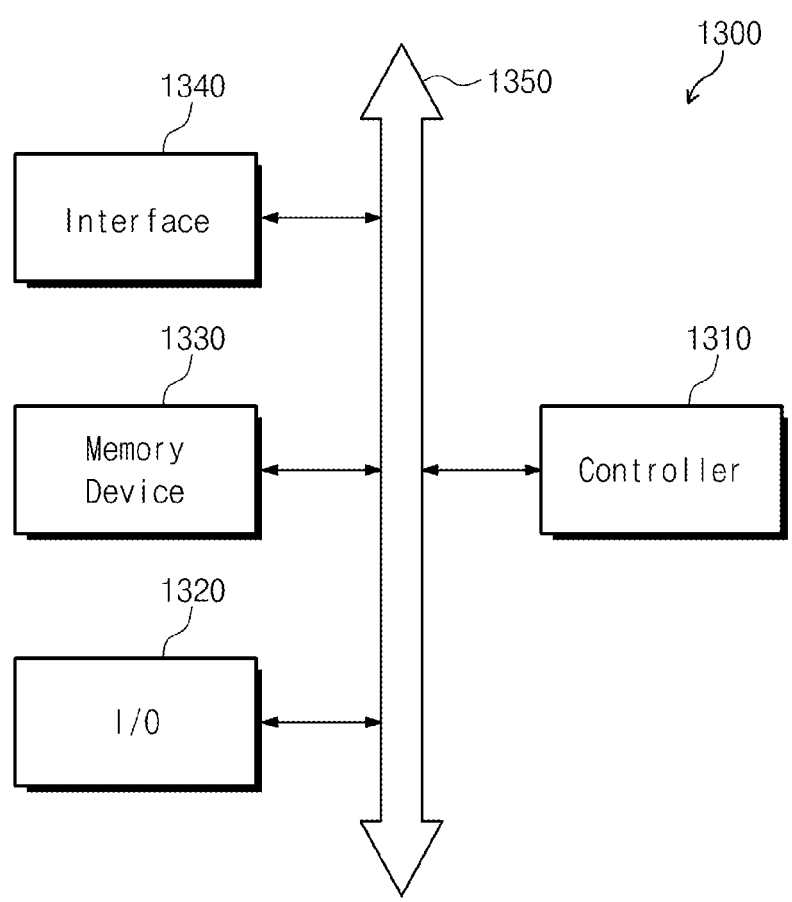
FIG. 16 is a schematic block diagram illustrating an example of electronic systems including semiconductor packages according to embodiments of the inventive concepts.
Figure 17:
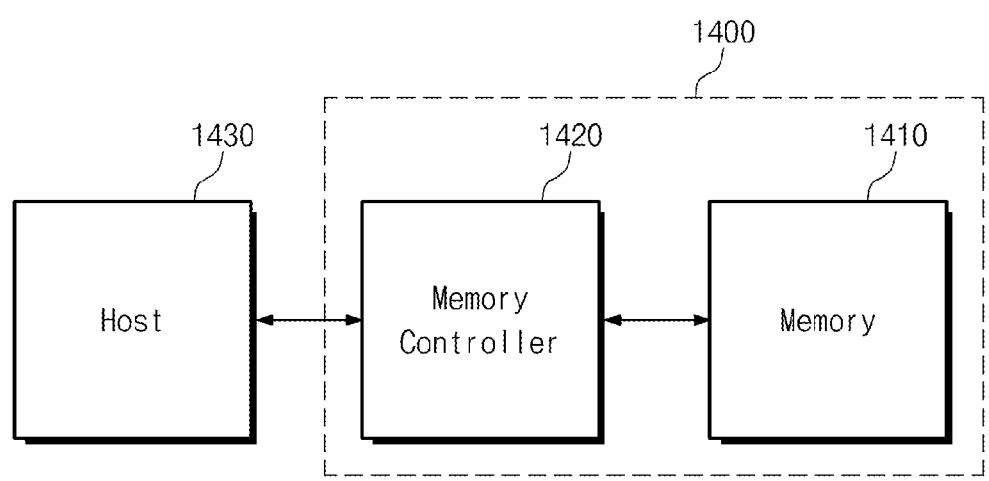
FIG. 17 is a schematic block diagram illustrating an example of memory systems including semiconductor packages according to embodiments of the inventive concepts.

FIG. 15 illustrates an example of package modules including semiconductor packages according to embodiments of the inventive concepts. FIG. 16 is a schematic block diagram illustrating an example of electronic systems including semiconductor packages according to embodiments of the inventive concepts. FIG. 17 is a schematic block diagram illustrating an example of memory systems including semiconductor packages according to embodiments of the inventive concepts.

Referring to FIG. 15, a package module 1200 may include a semiconductor integrated circuit chip 1220 and a semiconductor integrated circuit device 1230 packaged using a quad flat package (QFP) technique. The semiconductor devices 1220 and 1230 may include at least one of the semiconductor packages 1 to 3 according to embodiments of the inventive concepts. The package module 1200 may be connected to an external electronic device through external connection terminals 1240 provided on a side of a board 1210.

Referring to FIG. 16, an electronic system 1300 may include a controller 1310, an input/output (I/O) unit 1320, and a memory device 1330. The controller 1310, the I/O unit 1320, and the memory device 1330 may communicate with each other through a data bus 1350. The data bus 1350 may correspond to a path through which electrical signals are transmitted. For example, the controller 1310 may include at least one of a microprocessor, a digital signal processor, a microcontroller, or other logic devices having a similar function to any one thereof. The controller 1310 and the memory device 1330 may include at least one of the semiconductor packages 1 to 3 according to the aforementioned embodiments of the inventive concept. The I/O unit 1320 may include a keypad, a keyboard and/or a display unit. The memory device 1330 stores data. The memory device 1330 may store data and/or commands executed by the controller 1310. The memory device 1330 may include a volatile memory device and/or a non-volatile memory device. In some embodiments, the memory device 1330 may include a flash memory device. For example, the flash memory device applied with the semiconductor package technique according to the inventive concept may be installed in an information processing system such as a mobile device or a desk top computer. The flash memory device may be realized as solid state disks (SSD). In this case, the electronic system 1300 may stably store massive data in the memory device 1330. The electronic system 1300 may further include an interface unit 1340 that transmits electrical data to a communication network or receives electrical data from a communication network. The interface unit 1340 may operate by wireless or cable. For example, the interface unit 1340 may include an antenna for wireless communication or a transceiver for cable communication. Although not shown in the drawings, the electronic system 1300 may further include an application chipset and/or a camera image processor (CIS).

The electronic system 1300 may be realized as a mobile system, a personal computer, an industrial computer, or a multi-functional logic system. For example, the mobile system may be one of a personal digital assistant (PDA), a portable computer, a web tablet, a wireless phone, a mobile phone, a laptop computer, a digital music player, a memory card, or an information transmitting/receiving system. If the electronic system 1300 is an apparatus capable of performing a wireless communication, the electronic device 1300 may be used in a communication interface protocol such as a third generation communication system (e.g., CDMA, GSM, NADC, E-TDMA, WCDMA, CDMA2000).

Referring to FIG. 17, a memory system 1400 may include a non-volatile memory device 1410 and a memory controller 1420. The non-volatile memory device 1410 and the memory controller 1420 may store data or may read stored data. The non-volatile memory device 1420 may include at least one of the semiconductor packages 1 to 3 according to the aforementioned embodiments of the inventive concept. The memory controller 1420 may read data from/store data into the non-volatile memory device 1410 in response to read/write request of a host 1430.

The semiconductor package according to the inventive concepts may have the mold path including the inner path extending between the lower and upper plates and the mold hole penetrating the upper plate to be connected to the inner path. The mold layer may extend into the inner path through the mold hole. Thus, the mold layer may fill the space between the bumps, so that a void may not be generated in the mold layer between the bumps. The lower plate may cover the inner path such that the positions of the external terminals may not be limited by the inner path. The shape and the position of the inner path may be controlled to reduce or improve the warpage phenomenon of the semiconductor package.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor package comprising:
   a substrate comprising a lower plate and an upper plate, the substrate having a mold path, the mold path including an inner path extending between the lower and upper plates and a mold hole penetrating the upper plate, and the mold hole connected to the inner path;
   a semiconductor chip mounted on a top surface of the substrate; and
   a mold layer encapsulating the semiconductor chip, the mold layer further arranged in the mold path.

2. The semiconductor package of claim 1, wherein the mold layer extends into the inner path through the mold hole.

3. The semiconductor package of claim 1, wherein the inner path includes a first groove formed at a bottom surface of the upper plate.

4. The semiconductor package of claim 3, wherein the inner path further includes a second groove formed at a top surface of the lower plate, and
   wherein the second groove is in communication with the first groove.

5. The semiconductor package of claim 4, wherein the first groove extends in one direction, and
   wherein the second groove extends in another direction to cross the first groove.

6. The semiconductor package of claim 4, wherein the second groove includes a plurality of second grooves.

7. The semiconductor package of claim 3, wherein the mold hole is connected to the first groove.

8. The semiconductor package of claim 1, wherein the inner path includes a groove formed at a top surface of the lower plate.

9. The semiconductor package of claim 1, further comprising:
   bumps disposed between the substrate and the semiconductor chip,
   wherein the mold layer fills a space between the bumps.

10. The semiconductor package of claim 1, wherein the semiconductor chip overlaps with the mold hole.

11. A semiconductor package comprising:
    a substrate including a lower plate and an upper plate, a first groove formed in a bottom surface of the upper plate, a plurality of second grooves formed in a top surface of the lower plate, the second grooves combined with the first groove, a mold hole penetrating the upper plate, and the mold hole connected to the first groove;
    a semiconductor chip mounted on a top surface of the substrate; and
    a mold layer encapsulating the semiconductor chip, the mold layer further extending into the mold hole.

12. The semiconductor package of claim 11, wherein the mold layer further extends into the first groove and the second grooves.

13. The semiconductor package of claim 11, wherein the first groove extends in one direction, and
wherein the second grooves extends in another direction different from the one direction to cross the first groove.

14. A semiconductor package comprising:
a substrate having a mold hole penetrating at least a portion of the substrate and an inner path coupled to the mold hole and to a side surface of the substrate;
a semiconductor chip mounted on a top surface of the substrate; and
a mold layer encapsulating the semiconductor chip and further arranged in the mold hole.

15. The semiconductor package of claim 14, wherein the substrate comprises a lower plate and an upper plate, wherein the inner path is formed therebetween.

16. The semiconductor package of claim 14, wherein the mold layer extends into the inner path through the mold hole.

17. The semiconductor package of claim 14, wherein the inner path is not exposed at a bottom surface of the substrate.

18. The semiconductor package of claim 14, wherein the inner path is formed diagonally with respect to an edge of the substrate.

19. The semiconductor package of claim 14, wherein the inner path has a circular shape, a spiral shape, a curved line shape, or straight line shape.

* * * * *